(12) United States Patent
Kim

(10) Patent No.: US 10,593,738 B2
(45) Date of Patent: Mar. 17, 2020

(54) ORGANIC LIGHT-EMITTING DISPLAY DEVICE

(71) Applicant: LG Display Co., Ltd., Seoul (KR)

(72) Inventor: Ki-Dong Kim, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/103,240

(22) Filed: Aug. 14, 2018

(65) Prior Publication Data

US 2019/0058021 A1    Feb. 21, 2019

(30) Foreign Application Priority Data

Aug. 18, 2017 (KR) ........................ 10-2017-0105028

(51) Int. Cl.
| | |
|---|---|
| H01L 27/32 | (2006.01) |
| G09G 3/3225 | (2016.01) |
| H01L 51/52 | (2006.01) |
| H01L 51/10 | (2006.01) |
| G09G 3/3275 | (2016.01) |
| F21Y 115/15 | (2016.01) |

(52) U.S. Cl.
CPC ....... *H01L 27/3246* (2013.01); *G09G 3/3225* (2013.01); *G09G 3/3275* (2013.01); *H01L 27/3262* (2013.01); *H01L 27/3276* (2013.01); *H01L 51/105* (2013.01); *H01L 51/5237* (2013.01); *H01L 51/5246* (2013.01); *F21Y 2115/15* (2016.08); *G09G 2300/0819* (2013.01); *H01L 27/322* (2013.01); *H01L 27/3258* (2013.01); *H01L 51/5253* (2013.01); *H01L 51/5259* (2013.01)

(58) Field of Classification Search
CPC ............. H01L 27/3246; H01L 27/3262; H01L 32/3276; H01L 51/105; H01L 51/5237; H01L 51/5246; G09G 3/3225; G09G 3/3275; G09G 2300/0819; F21Y 2115/15
See application file for complete search history.

(56) References Cited

U.S. PATENT DOCUMENTS

| | | | | |
|---|---|---|---|---|
| 2010/0258346 A1* | 10/2010 | Chen | ........................ | H01L 21/56 174/521 |
| 2014/0117336 A1* | 5/2014 | Kim | ..................... | H01L 51/5246 257/40 |
| 2014/0118975 A1* | 5/2014 | Chen | ..................... | H05K 1/0281 361/761 |
| 2015/0060806 A1* | 3/2015 | Park | ..................... | H01L 51/5253 257/40 |
| 2015/0380685 A1* | 12/2015 | Lee | ..................... | H01L 51/5243 257/40 |
| 2016/0086977 A1* | 3/2016 | Go | ........................ | H01L 27/124 257/773 |
| 2016/0315284 A1* | 10/2016 | Jeon | ..................... | H01L 51/5256 |

\* cited by examiner

*Primary Examiner* — Sitaramarao S Yechuri
(74) *Attorney, Agent, or Firm* — Seed Intellectual Property Law Group LLP

(57) ABSTRACT

Disclosed is an organic light-emitting display device, in which a compensation pattern is selectively provided between two dam patterns depending on the arrangement density of a lower structure thereof, thereby making the width of a seal pattern uniform for each area. As a result, the reliability of the device is greatly improved.

18 Claims, 9 Drawing Sheets

ORGANIC LIGHT-EMITTING DISPLAY DEVICE

CROSS-REFERENCE TO RELATED APPLICATION(S)

This application claims the benefit of Korean Patent Application No. 10-2017-0105028, filed on Aug. 18, 2017, which is hereby incorporated by reference as if fully set forth herein.

BACKGROUND

Technical Field

The present disclosure relates to an organic light-emitting display device, and more particularly to an organic light-emitting display device, in which a compensation pattern is selectively provided between two dam patterns depending on the arrangement density of a lower structure thereof, thereby improving the reliability of the device.

Description of the Related Art

Recently, with the arrival of the information age, the field of displays for visually displaying electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered a competitive application because it does not require a separate light source and enables the realization of a compact device design and vivid color display.

The organic light-emitting display device includes organic light-emitting diodes, which are independently driven on a per-sub-pixel basis. Such an organic light-emitting diode includes an anode, a cathode, and an organic layer including an organic light-emitting layer disposed between the anode and the cathode.

An exemplary organic light-emitting display device is configured such that an array structure including a thin-film transistor and an organic light-emitting diode is formed corresponding to each sub-pixel on a lower substrate and such that an encapsulation substrate for encapsulating the organic light-emitting diode, which is vulnerable to moisture, is disposed so as to face the array structure. In addition, a seal pattern is provided so as to surround the edges of the region between the lower substrate and the encapsulation substrate, which are arranged vertically, in order to encapsulate the encapsulation substrate and the lower substrate from the permeation of external air in the lateral direction.

In general, a seal pattern material is dispensed to the encapsulation substrate, and the encapsulation substrate is arranged so as to face the lower substrate and is bonded to the same. However, the construction on the lower substrate is different for each of the areas of the top, bottom and two lateral sides of the lower substrate, and thus the degree of spreading of the seal pattern after the bonding is different for each area.

Therefore, an area in which the seal pattern is formed relatively thin is vulnerable to permeation of external air or moisture in the lateral direction. Further, the difference in width of the seal patterns formed in the respective areas accelerates the deterioration of the vulnerable area over time, thereby degrading the reliability of the device.

BRIEF SUMMARY

Accordingly, in various embodiments, the present disclosure is directed to an organic light-emitting display device that substantially obviates one or more problems due to limitations and disadvantages of the related art.

In some embodiments, the present disclosure provides an organic light-emitting display device, in which a compensation pattern is selectively provided between two dam patterns depending on the arrangement density of a lower structure thereof, thereby making the width of a seal pattern uniform for each area and consequently improving the reliability of the device.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light-emitting display device includes a substrate including an active area having a plurality of sub-pixels and a non-active area formed around a periphery of the active area, the non-active area including a pad portion at a first side, gate-driving portions at second and third sides that are contiguous to respective ends of the first side, and a non-pad portion at a fourth side that faces the first side and is located between the gate-driving portions at the second and third sides, an encapsulation substrate disposed to face the substrate, a first dam pattern and a second dam pattern spaced apart from each other in the non-active area of each of the first to fourth sides, each of the first dam pattern and the second dam pattern being formed in a closed-loop configuration, a seal pattern located between the first dam pattern and the second dam pattern and located between the substrate and the encapsulation substrate, and a first compensation pattern in the non-active area of the fourth side, the seal pattern covering the first compensation pattern. Embodiments provided herein may therefore compensate for surface deviation of the substrate among the non-active areas of the first to fourth sides.

Through this configuration, the organic light-emitting display device of the present disclosure is capable of minimizing variation in density (i.e., variations of the mass per unit volume) among the areas on the top surface of the substrate that overlap the seal pattern, thereby making the width of the seal pattern uniform for each area. As a result, the reliability of the device may be improved.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
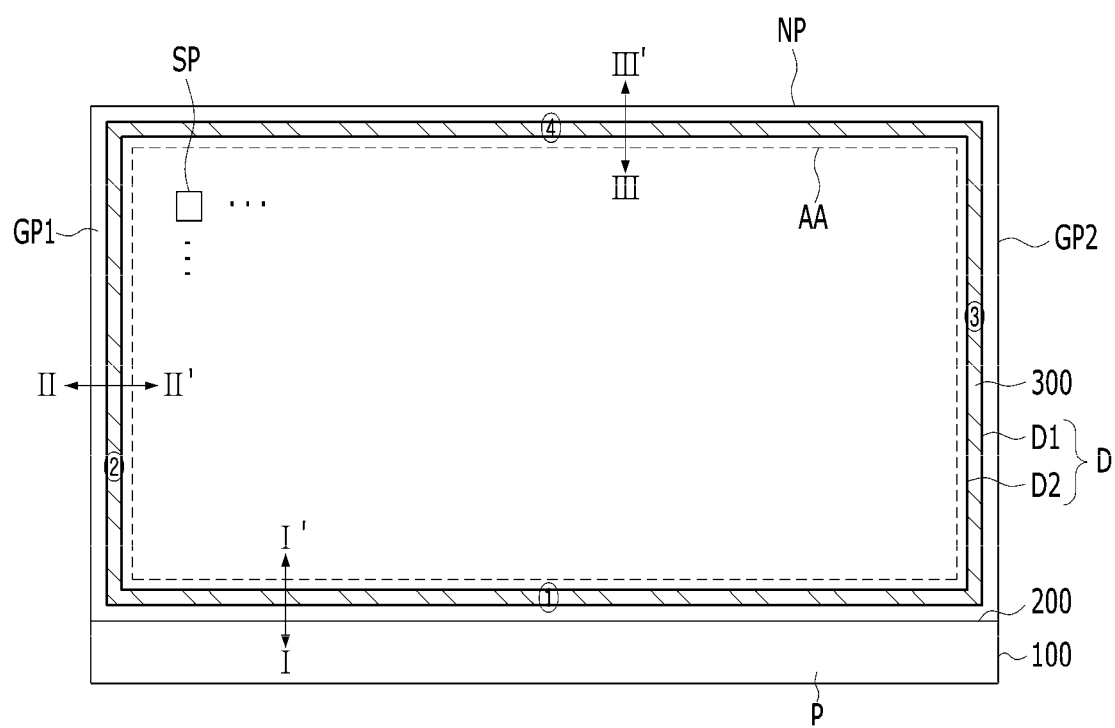
FIG. 1 is a plan view illustrating an organic light-emitting display device in accordance with one or more embodiments of the present disclosure.

The advantages and features of the present disclosure and the way of attaining them will become apparent with reference to embodiments described below in detail in conjunction with the accompanying drawings. The present disclosure, however, is not limited to the embodiments disclosed hereinafter, and may be embodied in many different forms. Rather, these exemplary embodiments are provided so that this disclosure will be thorough and complete and will fully convey the scope to those skilled in the art. The scope of the present disclosure should be defined by the claims.

In the drawings for explaining the exemplary embodiments of the present disclosure, the illustrated shape, size, ratio, angle, and number are given by way of example, and thus are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear.

The terms "comprises", "includes", and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present disclosure, the constituent elements are to be interpreted as including an error range even if there is no explicit description thereof.

In the description of the various embodiments of the present disclosure, when describing positional relationships, for example, when the positional relationship between two parts is described using "on", "above", "below", "next to", or the like, one or more other parts may be located between the two parts unless the term "directly" or "closely" is used.

In the description of the various embodiments of the present disclosure, when describing temporal relationships, for example, when the temporal relationship between two actions is described using "after", "subsequently", "next", "before", or the like, the actions may not occur in succession unless the term "immediately" or "just" is used therewith.

In the description of the various embodiments of the present disclosure, although terms such as, for example, "first" and "second" may be used to describe various elements, these terms are merely used to distinguish the same or similar elements from each other. Therefore, in the present specification, an element indicated by "first" may be the same as an element indicated by "second" without exceeding the technical scope of the present disclosure, unless otherwise mentioned.

The term "at least one" should be understood as including all possible combinations that can be suggested from one or more relevant items. For example, the meaning of "at least one of a first item, a second item, or a third item" may be each one of the first item, the second item, or the third item, and may also be all possible combinations that can be suggested from two or more of the first item, the second item, and the third item.

The respective features of the various embodiments of the present disclosure may be partially or wholly coupled to and combined with each other, and various technical linkages and modes of operation thereof are possible. These various embodiments may be performed independently of each other, or may be performed in association with each other.

Reference will now be made in detail to the preferred embodiments of the present disclosure, examples of which are illustrated in the accompanying drawings.

Figure 2A:
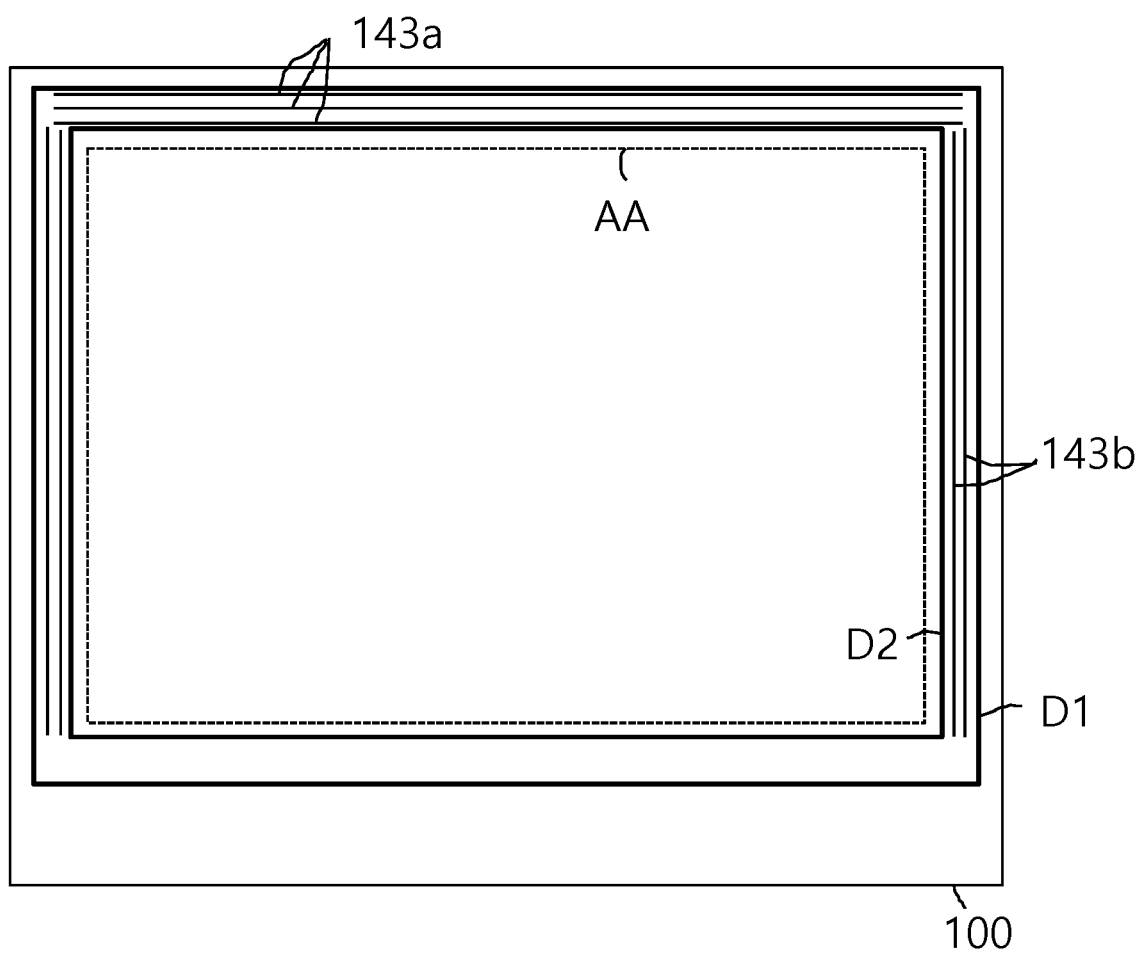
FIGS. 2A to 2C are plan views illustrating a dam pattern and a compensation pattern in various embodiments of the organic light-emitting display device of the present disclosure.
Figure 2B:
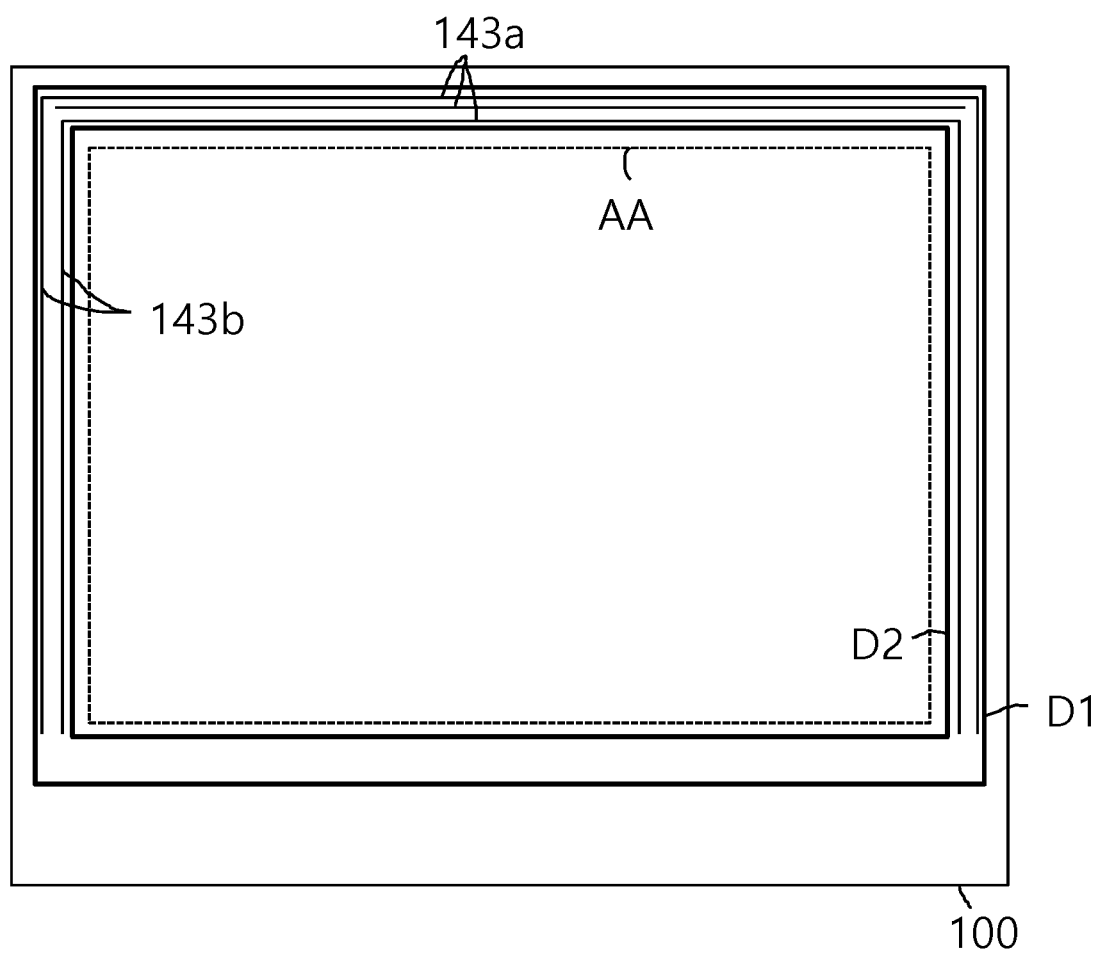
Figure 2C:
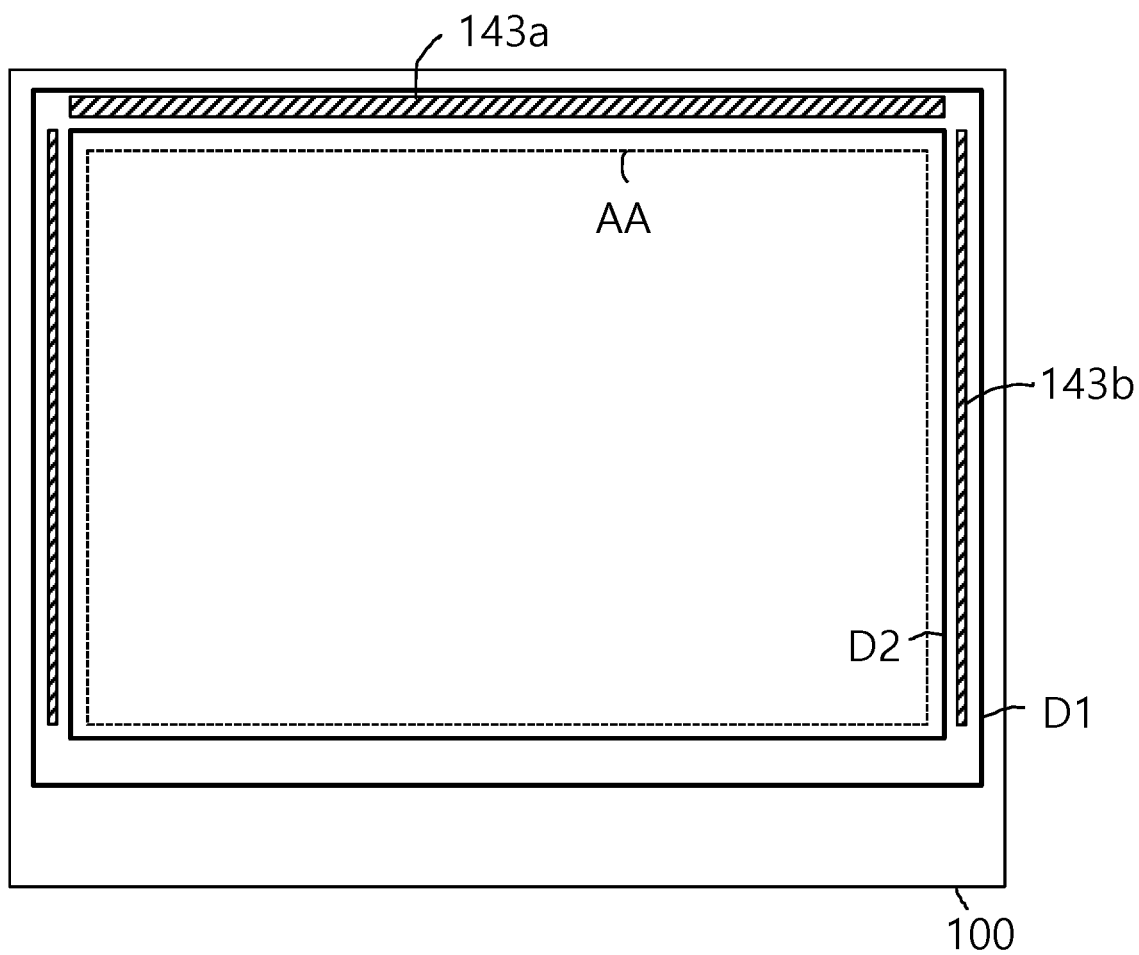
Figure 3A:
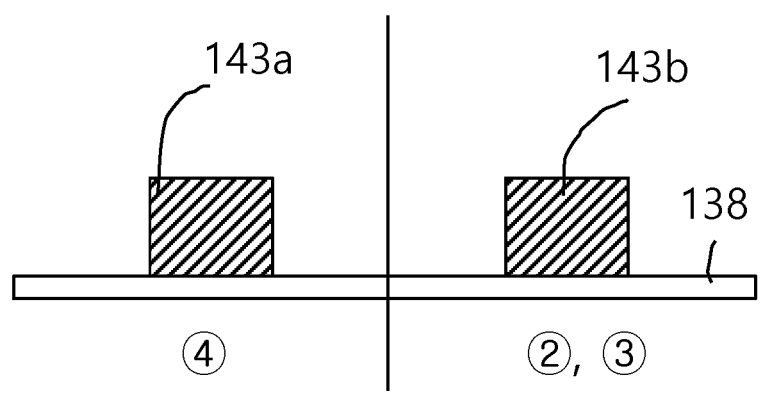
FIGS. 3A to 3C are cross-sectional views illustrating various embodiments of the compensation pattern of the present disclosure.
Figure 3B:
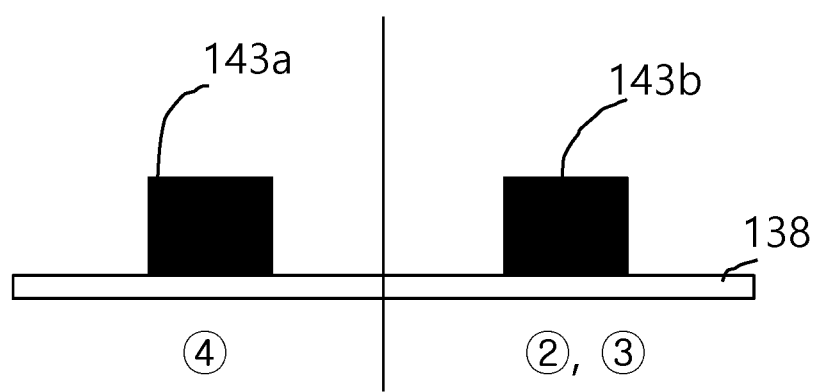
Figure 3C:
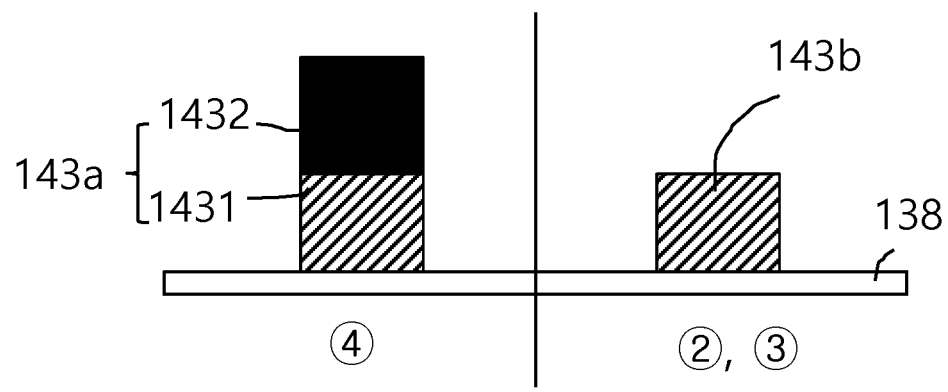

FIG. 1 is a plan view illustrating an organic light-emitting display device of the present disclosure, FIGS. 2A to 2C are plan views illustrating a dam pattern and a compensation pattern in various embodiments of the organic light-emitting display device of the present disclosure, and FIGS. 3A to 3C are cross-sectional views illustrating various embodiments of the compensation pattern of the present disclosure.

As shown in FIG. 1, the organic light-emitting display device in accordance with one or more embodiments of the present disclosure includes a substrate 100, which includes an active area AA having a plurality of sub-pixels SP and a non-active area formed around the active area, an encapsulation substrate 200, which is disposed to face the substrate 100, a first dam D1 and a second dam D2, which are spaced a predetermined distance apart from each other in the non-active area of the substrate 100 and each of which is formed in a closed-loop configuration (i.e., laterally surrounding the active area AA), a seal pattern 300, which is located between the first dam D1 and the second dam D2, as seen in a planar view, and which is located between the substrate 100 and the encapsulation substrate 200, as seen in a vertical cross-section, and a first compensation pattern (refer to 143a in FIGS. 2A to 3C), which is formed within the seal pattern 300 (e.g, the seal pattern 300 may substantially cover the first compensation pattern 143a) located in the non-active area formed at one side of the substrate 100 in order to compensate for a surface level difference of the substrate, which is present in the non-active area formed at each side of the substrate.

The non-active area includes a pad portion P formed at a first side ①, gate-driving portions GP1 and GP2 formed, respectively, at second and third sides ② and ③, which are contiguous to respective ends of the first side and opposite to one another, and a non-pad portion NP formed at a fourth side ④, which faces (e.g., is opposite to) the first side and is located between the gate-driving portions GP1 and GP2 formed at the second and third sides. The first compensation pattern 143a is located in the non-pad portion NP of the fourth side ④. The pad portion P is a portion of the substrate 100 that protrudes further than the encapsulation substrate 200. That is, the pad portion P is not covered or overlapped by the encapsulation substrate 200. The pad portion P is provided with a plurality of pad electrodes 135 (see FIG. 4), which are connected to a source driver (not shown) or to a flexible printed circuit board (not shown) so as to receive a drive signal from an external device.

In the organic light-emitting display device of the present disclosure, the surface of the substrate 100 in the non-active areas of the first to fourth sides ①, ②, ③ and ④ has different configurations in terms of the density of a metal layer disposed thereon or the area occupied by an overcoat layer. That is, different amounts and densities of various components or layers, such as metal layers and an overcoat layer, may be provided on the substrate 100 in the non-active areas of the first to fourth sides ①, ②, ③ and ④. Therefore, the first compensation pattern 143a is provided to compensate for these differences. Described in detail, when a seal pattern material is dispensed to either the substrate or the encapsulation substrate and the two substrates are bonded to each other, the seal pattern material may be spread nonuniformly due to the nonuniform surface structure of the substrate (or of the components or layers on the substrate 100), leading to nonuniformity of the widths of the seal patterns of the first to fourth sides ①, ②, ③ and ④. In order to solve this problem, in the organic light-emitting display device of the present disclosure, the first compensation pattern 143a is provided at a portion of the surface of the substrate 100 that has a relatively low density.

In some embodiments, among the non-active areas of the first to fourth sides, the surface structure of the substrate 100 in the non-active area of the fourth side ④, which the seal pattern 300 overlaps, has the lowest density, and therefore the first compensation pattern 143a is disposed in the non-active area of the fourth side ④.

As shown in FIGS. 2A to 2C, the organic light-emitting display device of the present disclosure may further include a second compensation pattern 143b, which is formed within (or substantially covered by) the seal pattern 300 in the non-active area of each of the second and third sides ②, ③ and which has a lower density than the first compensation pattern 143a. The surface structure of the substrate 100 in the non-active area of each of second and third sides ②, ③, which the seal pattern 300 overlaps, has a smaller volume than the surface structure of the substrate 100 in the non-active area of the first side ①, and therefore the second compensation pattern 143b is provided in the non-active area of each of the second and third sides ②, ③ in order to compensate for the relatively small volume of the area in which the seal pattern 300 is disposed.

That is, the surface structure of the substrate (e.g., the substrate 100 as well as the various components or layers on the substrate 100) has a substantially uniform volume or density over all non-active areas of the first to fourth sides ①, ②, ③ and ④ due to the provision of the first and second compensation patterns 143a and 143b, leading to uniform spreading of the seal pattern 300 during the process of bonding the substrate and the encapsulation substrate.

Because the surface structure of the substrate 100 in the non-active area of each of the second and third sides ② and ③ has a higher density than in the non-active area of the fourth side ④, the second compensation pattern 143b is formed to have a lower density than the first compensation pattern 143a. In this case, the difference in density between the first compensation pattern 143a and the second compensation pattern 143b may be made by increasing the number of first compensation patterns 143a so as to be greater than the number of second compensation patterns 143b, as shown in FIGS. 2A and 2B (see also the cross-sectional views of FIGS. 5 and 6), or by increasing the width of the first compensation pattern 143a so as to be greater than the width of the second compensation pattern 143b, as shown in FIG. 2C. Comparing the embodiment of FIG. 2A and the embodiment of FIG. 2B with each other, the embodiment of FIG. 2A is configured such that the first compensation pattern 143a and the second compensation pattern 143b are not connected to each other, and the embodiment of FIG. 2B is configured such that the first compensation pattern 143a and the second compensation pattern 143b are connected to each other. These two embodiments may be appropriately selected depending on the arrangement at the corners of the substrate 100. In some cases, each of the first and second compensation patterns 143a and 143b may be provided in a plural number and may be arranged in a row at a corresponding side. The first and second compensation patterns 143a and 143b are formed so as to be spaced apart from an overcoat layer (refer to 141 in FIGS. 4 to 6), which covers the active area AA and a portion of which overlaps the seal pattern 300. Because these components are formed of organic materials, the first and second compensation patterns 143a and 143b are spaced apart from the active area AA in order to prevent the overcoat layer 141 from being influenced by possible damage to the first and second compensation patterns 143a and 143b.

Alternatively, as seen in the vertical cross-sectional view illustrated in FIG. 3C, the first compensation pattern 143a may include a plurality of layers, namely, a first layer 1431, which is formed on the same layer as the overcoat layer 141, and a second layer 1432, which is formed on the same layer as a bank 161. The second compensation pattern 143b may include a single layer, which is formed on the same layer as the overcoat layer or the bank.

Alternatively, each of the first compensation pattern 143a and the second compensation pattern 143b may be divided into a plurality of patterns at a corresponding side in a manner such that the distance between the second compensation patterns 143b is greater than the distance between the first compensation patterns 143a, whereby the first compensation patterns 143a may be formed at a higher density than the second compensation patterns 143b. That is, the spacing between portions of the second compensation patterns 143b along a corresponding side is greater than the spacing between portions of the first compensation patterns 143a along the same side. Accordingly, the second compensation patterns 143b may have a lower density than the first compensation patterns 143a, since the second compensation patterns 143b have less mass per unit volume than the first compensation patterns 143a, due to the increased spacing between portions of the second compensation patterns 143b.

As shown in FIGS. 3A to 3C (see also FIGS. 4 to 6), the first and second compensation patterns 143a and 143b are provided to compensate for the difference in density between the areas, and are formed of the same material as the overcoat layer 141 or the bank 161, which has a relatively large thickness compared to other layers provided on the substrate 100. The thickness of the overcoat layer 141 or the bank 161 may range from about 1 μm to about 5 μm, specifically, from about 1.1 μm to about 3 μm. Therefore, since the thicknesses of the first and second compensation patterns 143a and 143b are large even though the widths thereof are small, the seal pattern 300 may be spread uniformly during the bonding process, whereby the surface structure of the substrate 100 has a substantially uniform density over all areas. The thickness of a metal layer or an inorganic insulation layer provided on the substrate 100 is about 5000 Å (=0.5 μm) or less, which is smaller than the thickness of the overcoat layer 141 or the bank 161. Therefore, when the metal layer or the inorganic insulation layer is formed to have the same width as the overcoat layer 141 or the bank 161, a portion of the substrate 100 in which the overcoat layer 141 or the bank 161 is provided may protrude further upwards than a portion of the substrate 100 in which the metal layer or the inorganic insulation layer is provided on a different layer from the overcoat layer 141 or the bank 161.

As shown in FIGS. 3A to 3C, the first and second compensation patterns 143a and 143b may be located on an interlayer insulation film 138. The interlayer insulation film 138 is an inorganic film, which serves to cover a thin-film transistor or which is located between metal layers or semiconductor layers that constitute the thin-film transistor. Although not illustrated in FIGS. 3A to 3C, the surfaces of the first and second compensation patterns 143a and 143b may be covered with a protective film 191, which is located on the top layer of the substrate 100, and the seal pattern 300 may be located so as to overlap the protective film 191 (see FIGS. 5 and 6).

The substrate 100 shown in FIG. 1 is formed in the shape of a rectangle that has the first to fourth sides, and the non-active areas of the first to fourth sides ①, ②, ③ and ④, which are located around the edges of the aforementioned active area, will be described under the condition that the shape of the substrate is rectangular.

However, the shape of the substrate 100 may be any other shape, for example, polygonal or circular, depending on demand or the development of technology. As such, even when the substrate 100 has a shape other than a rectangular shape, the above-described compensation patterns may be provided at a portion of the surface of the substrate 100 that has a relatively low density, e.g., at portions where the substrate 100 and components or layers thereon have a relatively low density. For example, when the substrate 100 has a polygonal shape having five or more sides, the compensation patterns may be provided in non-active areas of the five or more sides in the same or similar way as described herein with respect to a four-sided substrate.

Hereinafter, the respective areas of the organic light-emitting display device of the present disclosure will be described in detail with reference to cross-sectional views illustrated in FIGS. 4 to 6.

Figure 4:
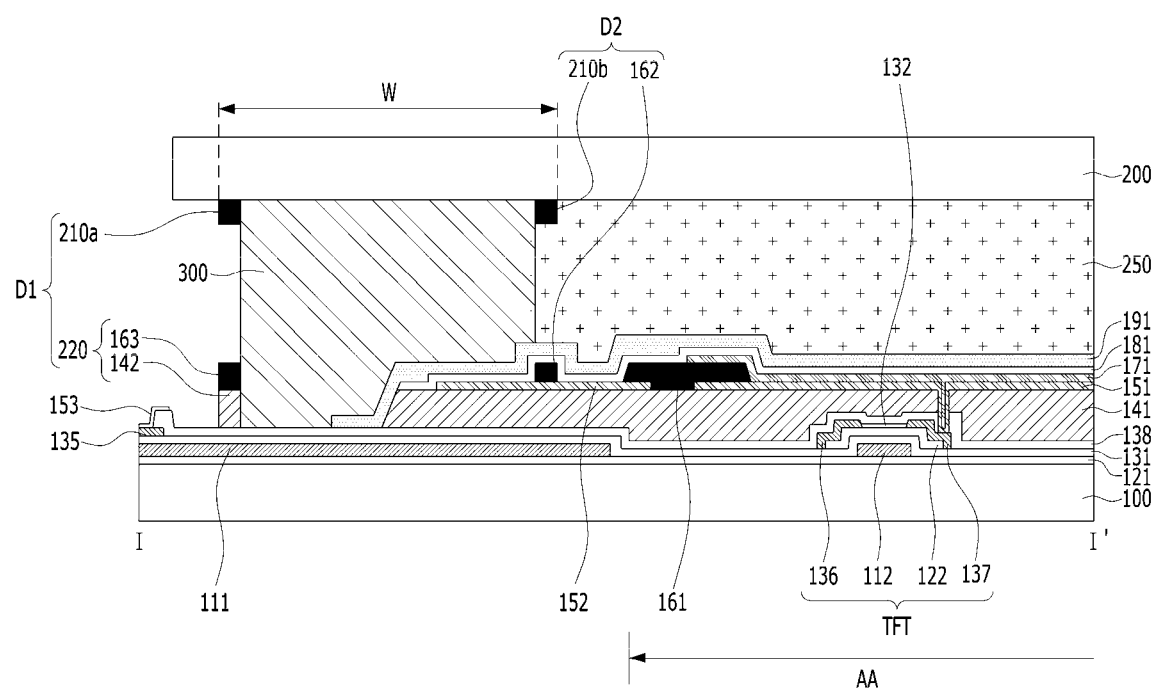
FIG. 4 is a cross-sectional view taken along line I-I' in FIG. 1.
Figure 5:
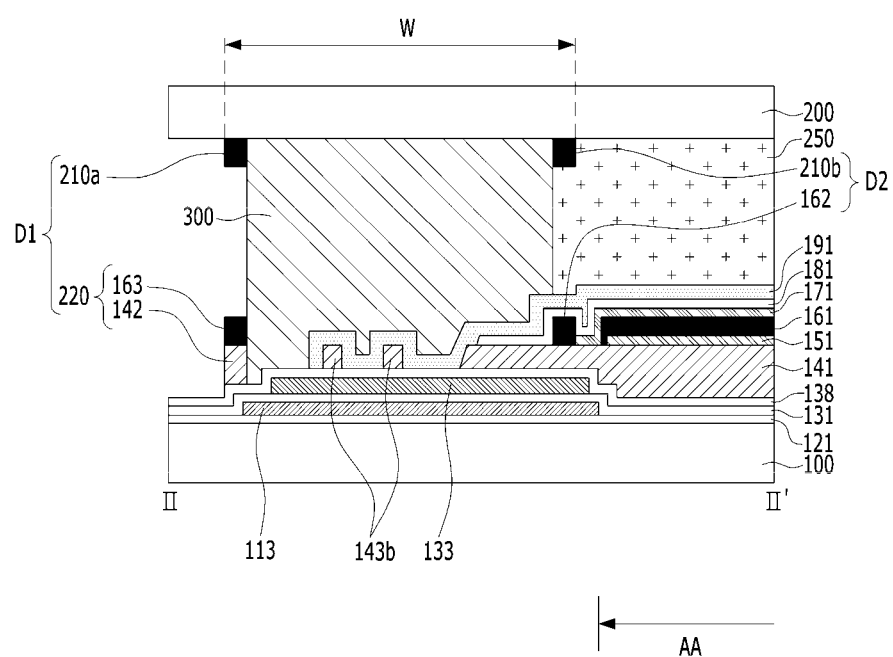
FIG. 5 is a cross-sectional view taken along line II-II' in FIG. 1.
Figure 6:
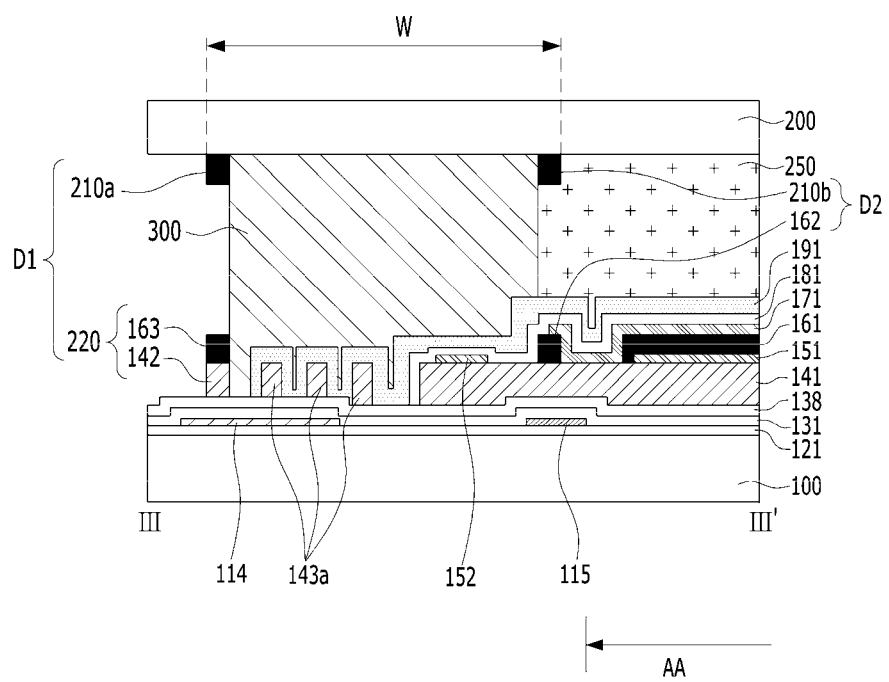
FIG. 6 is a cross-sectional view taken along line III-III'in FIG. 1.

FIG. 4 is a cross-sectional view taken along line I-I' in FIG. 1, FIG. 5 is a cross-sectional view taken along line II-II' in FIG. 1, and FIG. 6 is a cross-sectional view taken along line III-III' in FIG. 1.

Each sub-pixel in the active area AA includes at least one thin-film transistor TFT, an overcoat layer 141, which covers the thin-film transistor TFT, and an organic light-emitting diode (OLED), which is located on the overcoat layer 141 so as to be electrically connected to the thin-film transistor TFT and which is formed by stacking a first electrode 151, an organic light-emitting layer 171 and a second electrode 181. The organic light-emitting layer 171 is illustrated as a single layer. However, the present disclosure is not limited thereto. The organic light-emitting layer 171 may be formed in a multi-layer configuration, which includes an electroluminescent (EL) layer for emitting light, and a hole-related layer and an electron-related layer respectively disposed under and on the EL layer. Among FIGS. 4 to 6, the thin-film transistor TFT is illustrated only in FIG. 4. However, the present disclosure is not limited thereto. The thin-film transistor TFT may also be provided in the active area that is adjacent to a gate pad portion shown in FIG. 5, and may also be provided in the active area that is adjacent to a non-pad portion shown in FIG. 6.

The bank 161 for defining a light emission portion of the organic light-emitting diode (OLED) may be further provided at a boundary portion of the sub-pixel SP. The bank 161 may include black resin. The bank 161 may be formed of an organic material, and may have a thickness similar to the thickness of the overcoat layer 141, for example, a thickness ranging from about 1 μm to about 5 μm, and in some embodiments, from about 1.1 μm to about 3 μm.

The overcoat layer 141 is formed to cover the entire active area AA, except for a contact hole through which the thin-film transistor TFT and the first electrode 151 are connected to each other, and extends outwards from the active area so as to partially overlap the seal pattern 300. At this time, the non-active areas of the first to fourth sides ①, ②, ③ and ④ overlap the seal pattern 300 with different widths. As shown in FIG. 6, the overcoat layer 141 extends outwards from an area in which a shorting bar wiring layer 152 is provided. The shorting bar wiring layer 152 may be formed on the same layer as the first electrode 151 (e.g., on a surface of the overcoat layer 141) using a metal material. The interlayer insulation film 138 and a gate insulation film 131, each having a small thickness of about 2000 Å, are located under the overcoat layer 141. If the shorting bar wiring layer 152 protrudes outwards from the overcoat layer 141 and is located on the interlayer insulation film 138, a short circuit may occur between shorting bar wiring and source link wiring due to the formation of pin-holes in the thin insulation films. This can be prevented by the above-described configuration of the present disclosure. That is, the thick overcoat layer 141 is located at an area in which at least a source link wiring layer 111 is located under the shorting bar wiring layer 152. Therefore, even when the interlayer insulation film 138 and the gate insulation film 131, which are thin films, are damaged, the insulation between the shorting bar wiring layer 152 and the source link wiring layer 111 may be maintained. In order to stabilize the electric potential of the shorting bar wiring layer 152, the second electrode 181 covers the shorting bar wiring layer 152. At this time, the second electrode 181 is formed only on the top surface of the overcoat layer 141 in an area in which metal such as the source link wiring layer 111 or a gate metal layer 113, which is formed under the overcoat layer 141, is located. This configuration also serves to substantially prevent a short circuit between upper and lower metal layers attributable to pin-holes formed in the interlayer insulation film 138 and the gate insulation film 131, which are thin films. As shown in FIGS. 4 and 5, the second electrode 181 is located only on the top surface of the overcoat layer 141 in the non-active areas of the first, second and third sides, in which metal layers are located under the overcoat layer 141. As shown in FIG. 6, the second electrode 181 covers the side portion as well as the top surface of the overcoat layer 141, and extends to the top surface of the interlayer insulation film 138 that is adjacent to the overcoat layer 141 in the non-active area of the fourth side, in which no metal layers are located under the overcoat layer 141. Even in the configuration shown in FIG. 6, in order to prevent a short circuit, the second electrode 181 does not overlap a gate ground wiring layer 114. As shown in FIG. 6, the second electrode 181 may be formed in a single body in the entire active area and around the active area, may partially overlap the seal pattern 300, and may be electrically connected to the shorting bar wiring layer 152 around the active area.

In the substrate 100 shown in FIGS. 4 to 6, a buffer layer 121 is provided to prevent impurities in the substrate 100 from being introduced into the components formed on the substrate 100. Further, when predetermined processing is performed on the substrate 100, the buffer layer serves to prevent the components formed on the substrate from being affected by the processing. Also, an electrostatic stabilizing auxiliary line 115 is located on the same layer as the gate ground wiring layer 114 to have an electrostatic stabilization function of a power supply voltage line (VDD line). The electrostatic stabilizing auxiliary line 115 overlaps with the second dam pattern 162, and is electrically separated from the gate ground wiring layer 114.

The thin-film transistor TFT includes a gate electrode 112, a semiconductor layer 122, and a source electrode 136 and a drain electrode 137, which are connected to opposite sides of the semiconductor layer 122. The gate insulation film 131 is interposed between the gate electrode 112 and the semiconductor layer 122. The semiconductor layer 122 is formed of an oxide semiconductor material, and is illustrated as including an etch stopper 132 for protecting a channel portion during the process of patterning the source electrode 136 and the drain electrode 137. However, this thin-film transistor is merely illustrative, and the semiconductor layer 122 may be formed of amorphous silicon or polysilicon, or may include multiple silicon layers. In this case, the etch stopper 132 may be omitted.

The drain electrode 137 is electrically connected to the first electrode 151 of the organic light-emitting diode. The first electrode 151 may be formed of a reflective metal material, and the second electrode 181 may be formed of a transparent metal material. Conversely, the first electrode 151 may be formed of a transparent metal material, and the second electrode 181 may be formed of a reflective metal material. The former is a top-emission-type configuration, while the latter is a bottom-emission-type configuration. The illustrated configuration is a top-emission-type configuration, in which the transparency of the encapsulation substrate 200 is maintained.

In order to prevent oxidation of the pad electrodes 135, pad protection electrodes 153, which are formed on the same layer as the first electrode 151 using a metal material, may be provided on the pad electrodes 135.

A first dam pattern 220 and a second dam pattern 162 are provided beside both sides of the seal pattern 300 in order to define the area in which the seal pattern 300 is formed.

In addition, in order to protect the organic light-emitting diode, the protective film 191 is further provided on the top layer of the substrate 100 so as to sufficiently cover the second electrode 181. The protective film 191 is an inorganic insulation film, which is formed of silicon oxynitride (SiON) or the like and which is thicker than the gate insulation film 131 and the interlayer insulation film 138, which are insulation films of the thin-film transistor array. This protective film 191 serves to primarily prevent foreign substances remaining between the substrate 100 and the encapsulation substrate 200 from permeating the organic light-emitting diode. The buffer layer 121, the gate insulation film 131 and the interlayer insulation film 138 are inorganic films. The overcoat layer 141, the bank 161, the first and second compensation patterns 143a and 143b and the first to fourth dam patterns 220, 162, 210a and 210b are formed of organic materials.

Even though the first dam pattern 220 and the second dam pattern 162 were described above as being provided on the substrate 100, the encapsulation substrate 200 may be formed to exhibit the function of the dam, as shown in FIGS. 4 to 6. A third dam pattern 210a and a fourth dam pattern 210b may be further provided on the surface of the encapsulation substrate 200 that faces the substrate 100 so as to face the first dam pattern 220 and the second dam pattern 162.

The first dam pattern 220 may include a dummy overcoat layer 142 and a bank layer 163 stacked on the dummy overcoat layer 142. The dummy overcoat layer 142 is formed on the same layer as the overcoat layer 141 and is spaced apart from the same. The bank layer 163 is formed on the same layer as the bank 161 and is spaced apart from the same. The second dam pattern 162 is formed on the same layer as the bank 161 and is spaced apart from the same. In this case, each of the first dam pattern 220 and the second dam pattern 162 has a layer structure identical or similar to the first compensation pattern 143a or the second compensation pattern 143b. This means that these components may be formed in the same process. That is, according to the present disclosure, the first and second compensation patterns 143a and 143b may be formed in the process of defining the overcoat layer 141 and the bank 161 without an additional forming process. Each of the first and second compensation patterns 143a and 143b is located so as to be spaced apart from the first and second dam patterns 220 and 162, which are located beside both sides of each of the first and second compensation patterns 143a and 143b. Therefore, the first and second compensation patterns 143a and 143b are capable of independently adjusting the density of the top surface of the substrate 100. Further, the first and second compensation patterns 143a and 143b are located within (e.g., are covered by) the seal pattern 300, and are therefore protected by a getter included in the seal pattern 300. As such, since the first and second compensation patterns 143a and 143b, which are formed of an organic material, are protected by the seal pattern 300 including a getter, the reliability of the device is enhanced.

The third dam pattern 210a and the fourth dam pattern 210b may also be formed in the process of forming a black matrix layer (not shown) or a color filter layer (not shown) on the encapsulation substrate 200. These components are spaced apart from one another. The dam patterns are spaced apart from each other and the dam patterns are also spaced apart from the overcoat layer, the black matrix layer and the color filter layer in order to block moisture permeation routes. The black matrix layer may be formed to have a shape corresponding to the shape of the bank 161 provided on the substrate 100. The color filter layer may be provided corresponding to the organic light-emitting diode of each sub-pixel. In this case, both sides of the color filter layer may overlap those of the black matrix layer.

In the substrate 100 and the encapsulation substrate 200, the first dam pattern 220 and the third dam pattern 210a, which are located at the same position, as seen in a planar view, are collectively referred to as a "first dam D1", which defines the outer line of the seal pattern 300, and the second dam pattern 162 and the fourth dam pattern 210b, which are located at the same position, as seen in a planar view, are collectively referred to as a "second dam D2", which defines the inner line of the seal pattern 300. These first and second dams D1 and D2 are collectively referred to as a "dam D". The organic light-emitting display device of the present disclosure is configured such that the width W of the dam D in the non-active area of each of the first to fourth sides is equal to the width W of the dam D in the non-active areas of the other sides.

The seal pattern 300 is formed of a liquid material having a certain initial viscosity, which mainly includes an organic material, such as epoxy having adhesive properties, and a polymer material including a photoinitiator or a thermal initiator. A plurality of getters having a moisture absorption function is dispersed in the polymer material. In this case, each getter may be formed of one selected from among calcium chloride, silica gel, activated alumina, lithium chloride, and triethylene glycol. Such a getter is a solid component included in the polymer material, which is formed in the shape of a sphere having a diameter ranging from about 0.5 µm to about 3 µm or in the shape of a cylinder or a polygonal prism having a height ranging from about 0.5 µm to about 3 µm. The getters are dispersed in the liquid material that constitutes the seal pattern 300 in the initial step, and the positions of the getters are fixed within the seal pattern 300 when the liquid material is cured. The getters prevent moisture and external air, which are introduced from lateral sides, from permeating the seal pattern 300, thereby protecting the organic light-emitting array, which is located in the active area, from moisture or external air. The seal pattern 300 is dispensed to the top surface of the substrate 100, on which the thin-film transistor array and the organic light-emitting array have been completely formed, or to the non-active area of the encapsulation substrate 200, on which the array of the black matrix layer and the color filter layer has been completely formed, so as to surround the edges of the active area AA. In the process of forming the seal pattern, because the liquid material having a certain viscosity is consistently dispensed, the dispensed liquid material has the same width on every area. However, because this liquid material has fluidity, when the substrate 100 and the encapsulation substrate 200 are bonded to each other and receive pressure, the liquid material may be spread nonuniformly due to surface deviation of the substrate 100. When the distance between the substrate 100 and the encapsulation substrate 200 becomes a predetermined value after the bonding, the seal pattern 300 is cured by heat or UV and changes into a solid state, whereby the distance between the substrate 100 and the encapsulation substrate 200 can be maintained constant.

In order to drive the sub-pixels SP in the active area AA, the substrate 100 includes wirings and a driving unit, which are provided in the non-active areas of the first to fourth sides ①, ②, ③ and ④. Depending on the arrangement of a source drive (not shown) for transmitting signals or a flexible printed circuit board (not shown), the wirings and the driving unit may be arranged at other sides. Accordingly, a density difference is present among the surfaces of the non-active areas of the first to fourth sides ①, ②, ③ and ④ of the substrate 100, on which the thin-film transistor array is also formed. Referring to FIG. 1, the non-active area of the first side ①, in which the pad portion P is provided, is provided with the source link wiring layer 111, which is connected to the pad electrodes 135 (see FIG. 4) in the non-active area of the first side ①. In this case, the source link wiring layer 111 includes lines, the number of which is equal to or greater than the number of data lines in the active area. Therefore, the wiring density in the non-active area of the first side ① is relatively large. In the active area AA, gate lines (not shown, the same layer as 112 in FIG. 4) are arranged at the boundary portion of each sub-pixel SP in the horizontal direction, and data lines (not shown) are arranged at the boundary portion of each sub-pixel SP in the vertical direction. The source link wiring layer 111 serves to apply signals to the data lines, and is disposed between the lower end of the active area AA and the pad portion P. The source link wiring layer 111 is located on the same layer as the gate lines and the gate electrode 112. At this time, the source link wiring layer 111 may be electrically connected to the pad electrodes 135 provided at the pad portion P. The source link wiring layer 111 may be formed integrally with the data lines (the same layer as 136 and 137) as needed.

In addition to the pad electrode connected to the source link wiring layer 111, the pad portion P further includes pad electrodes (not shown) for transmitting a driving voltage signal, a gate ground signal and a gate clock signal to the gate-driving portions GP1 and GP2. In this case, when the pad electrode for transmitting the data-related signals is located at the center of the pad portion P, the pad electrodes for transmitting the aforementioned gate-related signals are located besides both sides of the pad electrode for transmitting the data-related signals.

The pad electrodes are provided at the pad portion P of the substrate 100, which protrudes further than the encapsulation substrate 200, and the source link wiring layer 111 is located between the pad portion P and the active area AA so as to be connected to the pad portion P. The source link wirings of the source link wiring layer 111 extend from the pad portion P in the vertical direction on the basis of FIG. 1, overlap the seal pattern 300, and are integrally connected to the data lines (the same layer as 136 and 137 in FIG. 2), which are located at the lower edge of the active area AA.

The gate-driving portions GP1 and GP2 may include gate circuit blocks corresponding to the gate lines. Each of the gate circuit blocks may include a shift register, a level shifter, and a buffer. The shift register, the level shifter and the buffer may be constituted by combinations of a plurality of wirings and a plurality of thin-film transistors. As seen in the cross-section of a portion of the non-active area of the second side, which is illustrated in FIG. 3, the gate metal layer 113 and a data metal layer 133 completely overlap the seal pattern 300. However, this merely illustrates a portion of the cross-section through which the wirings pass, and the gate-driving portions GP1 and GP2 may be actually provided with a plurality of thin-film transistors and a plurality of wirings. The gate-driving portions GP1 and GP2 may be formed by patterning electrodes of the gate metal layer 113, which is formed on the same layer as the gate lines in the active area AA, a material (not shown) provided on the same layer as the semiconductor layer 132, and a layer formed on the same layer as the source metal layer 133, which is formed on the same layer as the data lines.

As shown in FIGS. 1 and 5, the non-active areas of the second and third sides ② and ③ are respectively provided with the gate-driving portions GP1 and GP2. The gate-driving portions GP1 and GP2 are formed in a gate-in-panel type. That is, the driving portions for driving the gate lines are not formed in a separate chip or film type, but are embedded in the non-active areas of the second and third sides ② and ③ of the substrate 100. The gate-driving portions GP1 and GP2 may be formed such that a plurality of thin-film transistors and a plurality of wirings overlap each other, and may be formed through patterning when the thin-film transistor TFT is formed at the active area AA. That is, while the thin-film transistor TFT is formed, the gate-driving portions GP1 and GP2 are formed by connecting similar thin-film transistors including semiconductor layers and metal layers 113 and 133, which are the same as the metal layers included in the thin-film transistor TFT, to the edges of the respective gate lines.

The first dam pattern 220 may further include the dummy overcoat layer 142, which is a lower component of the first dam pattern 220 and is formed on the same layer as the overcoat layer 141. This is for making the vertical position of the top surface of the first dam pattern 220 equivalent to the vertical position of the top surface of the second dam pattern 162. This is because the second dam pattern 162 is formed on the overcoat layer 141, which extends from the active area AA. Moreover, this configuration can prevent a problem in which the seal pattern 300 overflows a low dam pattern when the seal pattern 300 is spread.

Since the first dam pattern 220 is spaced apart from the overcoat layer 141 and is formed of only an organic material, even when a small amount of moisture permeates the first dam pattern 220, the moisture is prevented from being transferred to the overcoat layer 141, which is formed in a single body in the active area AA.

As shown in FIGS. 4 to 6, the first and second compensation patterns 143a and 143b may be formed of the same organic material as the material of the overcoat layer 141. The first and second compensation patterns 143a and 143b are physically spaced apart from the first dam pattern 220 and the overcoat layer 141, which are located beside both sides of each of the first and second compensation patterns 143a and 143b. Therefore, even when a small amount of moisture permeates the first dam pattern 220 from the outside, moisture permeation is blocked between the first dam pattern 220 and the first and second compensation patterns 143a and 143b and between the first and second compensation patterns 143a and 143b and the overcoat layer 141, whereby moisture or external air is prevented from being introduced into the device through the overcoat layer 141.

The third dam pattern 210a and the fourth dam pattern 210b may also be formed in the process of forming the black matrix layer (not shown) and the color filter layer (not shown) corresponding to the active area on the encapsulation substrate 200. If the organic light-emitting layers 171 of the organic light-emitting diodes, which are provided in the adjacent sub-pixels SP, are embodied as light-emitting layers of different colors, which are configured to emit light beams of different colors, the black matrix layer or the color filter layer may be omitted from the encapsulation substrate 200, which is illustrated in FIGS. 2 to 4. If the color filter layer is provided at the encapsulation substrate 200, the organic light-emitting layer 171 of each of the sub-pixels SP may be a light-emitting layer configured to emit a white light beam.

As seen in the vertical cross-section, a filler 250 is provided in the area surrounded by the seal pattern 300 between the substrate 100 (including, e.g., the various components and layers on the substrate 100) and the encapsulation substrate 200 (including, e.g., components formed on the encapsulation substrate 200), thereby maintaining a constant distance between the substrate 100 and the encapsulation substrate 200. The filler 250 may come into contact with the seal pattern 300 in the filling process after the bonding. However, since the filler 250 and the seal pattern 300 are formed of different materials from each other and the filler 250 is disposed so as to contact the seal pattern 300 after the seal pattern 300 has been pre-cured or cured, interference between the filler 250 and the seal pattern 300 does not occur.

As described above, according to the organic light-emitting display device of the present disclosure, although the thin-film transistor array or the organic light-emitting array formed on the substrate 100 is different for each area and the arrangement of the link wirings and the driving portion, which are connected to the thin-film transistor array or the organic light-emitting array, is different for each side, the compensation patterns 143a and 143b are provided on the portions of the top surface of the substrate 100 that have a relatively low density in order to compensate for the low density, thereby reducing variation in density among the areas. Therefore, the seal pattern 300 remains between the first dam D1 and the second dam D2 after the bonding, whereby the width W of the seal pattern 300 is the same for each area. The width of the dam, which is defined by the seal pattern 300 and the first and second dams D1 and D2 located beside both sides of the seal pattern 300, is the same for each area. In addition, as shown in FIGS. 4 to 6, the area occupied by the seal pattern 300 in the vertical cross-section of each of the sides is substantially constant.

Figure 7:
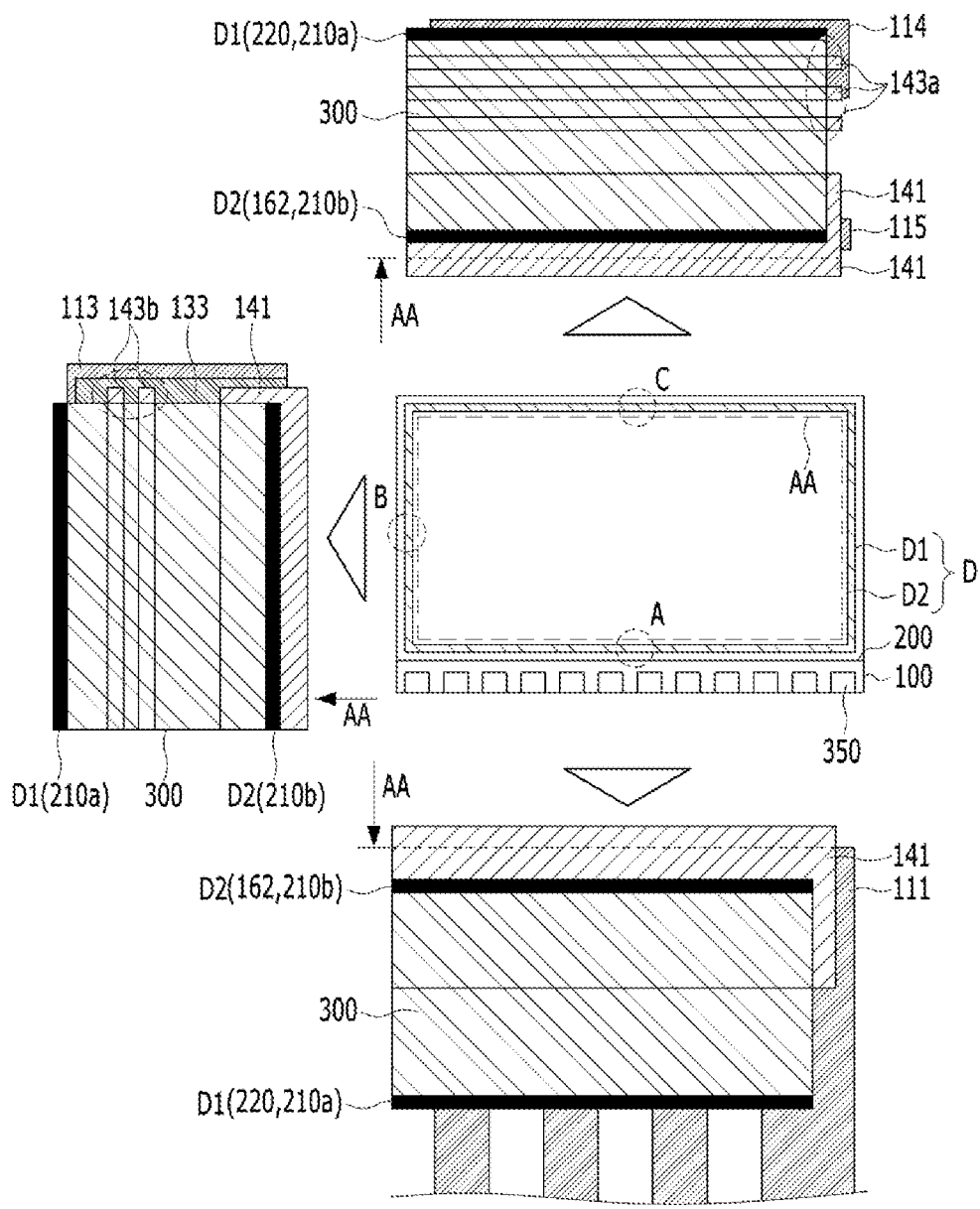
FIG. 7 is a plan view illustrating non-active areas of first to fourth sides in the organic light-emitting display device of the present disclosure.

FIG. 7 is a plan view illustrating the non-active areas of the first to fourth sides in the organic light-emitting display device of the present disclosure.

FIG. 7 illustrates the construction on the substrate 100 that overlaps the seal pattern 300, specifically, illustrates the non-active area (area A) of the first side, the non-active area (area B) of the second side, and the non-active area (area C) of the fourth side. The non-active area of the third side, which faces the second side, has the same configuration as the illustrated area B.

In the non-active area (area A) of the first side, the source link wirings of the source link wiring layer 111 extend in the vertical direction, and are electrically connected to the pad electrodes 135 (see FIG. 2, not illustrated in FIG. 5) of the pad portion, which are located outside the seal pattern 300. The pad electrodes are bonded to a source driver 350 and receive electrical signals. Although not illustrated, the source driver 350 may be connected to the printed circuit board located on the rear surface of the substrate 100, and may receive timing signals, power voltage signals, etc.

The source driver 350 may be provided in a plural number, and each source driver 350 may be bonded and connected to hundreds of pad electrodes.

In FIG. 7, in order to clearly show the construction of the other layers, the widths of the seal pattern 300 and the first and second dams D1 and D2 are reduced. However, the seal pattern 300 and the first and second dams D1 and D2 are continually formed in a closed-loop configuration in the actual embodiment, as shown in FIG. 1. In the non-active area (area A) of the first side, the seal pattern 300 and the first and second dams D1 and D2 extend continually in the horizontal direction.

In the same way, in FIG. 7, in order to clearly show the construction of the other layers, the width of the overcoat layer 141 is reduced. However, the overcoat layer 141 is formed to cover the entire active area AA, except for the contact hole through which the drain electrode 137 of the thin-film transistor and the first electrode 151 are connected to each other, and extends outwards from the active area. In the non-active area (area A) of the first side, the seal pattern 300 and the first and second dams D1 and D2 extend continually in the horizontal direction.

Similar to the configuration of the first side, in the non-active area (area C) of the fourth side, the seal pattern 300 and the first and second dams D1 and D2 extend continually in the horizontal direction. In the non-active area (area C) of the fourth side, which has the non-pad portion, wirings other than the gate ground wiring layer 114 are not arranged, or the wiring density is extremely low. The overlap area between the overcoat layer 141 and the seal pattern 300 in the non-active area (area C) of the fourth side is relatively small. That is, the construction on the substrate 100 in the non-active area (area C) of the fourth side has a lower density than that in the non-active area (area A) of the first side. Therefore, the first compensation pattern 143a, which is formed of the same material as the overcoat layer 141 and is spaced apart from the same, is formed in the non-active area (area C) of the fourth side. The first compensation pattern 143a may be provided in a plural number so that the area occupied by the components on the substrate 100 in the non-active area (area C) of the fourth side is equivalent to the area occupied by the components on the substrate 100 in the non-active area (area A) of the first side. A portion of the first compensation pattern 143a may be spaced apart from the overcoat layer 141, and may overlap the gate ground wiring layer 114, which is provided in the non-active area of the fourth side and is formed on the same layer as one electrode of the thin-film transistor. Since the number of first compensation patterns 143a in the non-active area of the fourth side is relatively large, a portion of the first compensation patterns 143a may overlap the gate ground wiring layer 114, a portion of which protrudes outwards from the seal pattern 300 in the width direction.

In each of the non-active areas (areas B) of the second and third sides, the seal pattern 300 and the first and second dams D1 and D2 extend continually in the vertical direction. The non-active areas (areas B) of the second and third sides are provided with the gate-driving portions GP1 and GP2, which are formed by patterning the gate metal layer 113, the data metal layer 133, and the semiconductor layer (although not illustrated in the cross-sectional view of FIG. 6, the semiconductor layer is included in order to serve as circuits of the gate-driving portions). In addition, in each of the non-active areas (areas B) of the second and third sides, the overcoat layer 141 is located so as to partially overlap the seal pattern 300. However, the width of the overcoat layer 141, which occupies a relatively large volume, in each of the non-active areas (areas B) of the second and third sides is smaller than that in the non-active area (area A) of the first side. Therefore, the overlap area between the overcoat layer 141 and the seal pattern 300 in each of the non-active areas (areas B) of the second and third sides is relatively small. That is, the construction on the substrate 100 in each of the non-active areas (areas B) of the second and third sides has a lower density than that in the non-active area (area A) of the first side. Therefore, the second compensation pattern 143b, which is formed of the same material as the overcoat layer 141 and is spaced apart from the same, is formed in each of the non-active areas (areas B) of the second and third sides. In this case, since each of the non-active areas (areas B) of the second and third sides is further provided with the gate metal layer 113 and the data metal layer 133 compared to the non-active area (area C) of the fourth side, the number of second compensation patterns 143b is set to be smaller than the number of first compensation patterns 143a. As shown in FIG. 5, the second compensation pattern 143b is spaced apart from the overcoat layer 141 and overlaps the gate-driving portions (refer to 113 and 133), whereby the density in the non-active areas of the first to fourth sides on the top surface of the substrate 100 is substantially uniform.

The second compensation pattern 143b and the first compensation pattern 143a may be connected to each other at the corner. In this case, the non-active area (area C) of the fourth side may be further provided with an additional pattern, which is spaced apart from the second compensation pattern 143b.

The common feature among the non-active areas (area A, areas B, and area C) of the first to fourth sides is that the seal pattern 300 and the overcoat layer 141 partially overlap each other, while only the widths thereof are different for each non-active area.

Among the non-active areas (area A, areas B, and area C) of the first to fourth sides, with the first and second compensation patterns 143a and 143b excluded, the density of the components on the substrate 100 in the non-active area (area A) of the first side is the highest, and the density of the components on the substrate 100 in the non-active area (area C) of the fourth side is the lowest.

The overlapping width between the seal pattern 300 and the overcoat layer 141 in the non-active area (area A) of the first side is the largest compared to that in each of the non-active areas (areas B, area C) of the second to fourth sides.

The density of the shorting bar wiring layer or the other metal layers in the non-active area (area A) of the first side may be the highest compared to that in each of the non-active areas (areas B, area C) of the second to fourth sides. It is illustrated in FIG. 5 that the gate metal layer 113 and the data metal layer 133 are formed at the largest proportion in the non-active area (area B) of the second side. However, because only the areas A to C of the respective sides are illustrated in the drawings and because the gate metal layer 113 and the data metal layer 133 of the second side are formed through patterning due to the characteristics of the gate circuit block, the density of the gate metal layer 113 and the data metal layer 133 in the non-active area (area B) of the second side may be lower than that in the non-active area (area A) of the first side. In some cases, the density of the metal layers in the non-active area (area A) of the first side may be similar to that in each of the non-active areas (areas B) of the second and third sides. Even in this case, because the overcoat layer 141, which primarily determines the overlap area with the seal pattern 300, has a relatively small area in each of the non-active areas (areas B) of the second and third sides compared to the non-active area (area A) of the first side, it is desirable for each of the non-active areas (areas B) of the second and third sides to be provided with the second compensation pattern 143b in order to compensate for the density of the components on the substrate 100, which is insufficient compared to the density in the non-active area (area A) of the first side.

As described above, according to the organic light-emitting display device of the present disclosure, although the thin-film transistor array or the organic light-emitting array formed on the substrate 100 is different for each area and the arrangement of the link wirings and the driving portion, which are connected to the thin-film transistor array or the organic light-emitting array, is different for each side, the compensation patterns 143a and 143b are provided on the portions of the top surface of the substrate 100 that have a relatively low density in order to compensate for the low density, thereby reducing variation in density among the areas. Therefore, the seal pattern 300 remains between the first dam D1 and the second dam D2 after the bonding, whereby the width of the seal pattern 300 is the same for each area. That is, even when the seal pattern material, which is dispensed in the initial step, is spread by the bonding, because the arrangement of the overlap areas on the substrate 100 is substantially the same for each area, the seal pattern 300 is located within the first and second dams D1 and D2, and the degree of spreading of the completed seal pattern 300 is similar for each area. Therefore, the width encapsulated by the seal pattern 300 is substantially the same for each of the non-active areas of the first to fourth sides. That is, the cross-section of the seal pattern 300 is substantially the same for each of the non-active areas of the first to fourth sides ①, ②, ③ and ④. In other words, as seen in the vertical cross-sections illustrated in FIGS. 4 to 6, the area of the protruding portion of the lower construction, which includes the first compensation pattern 143a or the second compensation pattern 143b, between the substrate 100 and the encapsulation substrate 200 is similar for each of the non-active areas of all sides, and accordingly the cross-sectional area of the seal pattern 300, which is located at a region other than the region occupied by the protruding portion, is the same for each of the non-active areas of the first to fourth sides. As a result, the seal pattern 300 can exhibit an encapsulation function without variation among the areas, and it is possible to prevent the generation of a vulnerable region, prevent shortening of the lifespan attributable to permeation of moisture through a vulnerable region, and improve the reliability of the device.

In a conventional organic light-emitting display device, which does not include the first and second compensation patterns of the present disclosure, although a first dam and a second dam for defining a region for formation of a seal pattern are provided at a substrate or an encapsulation substrate, when a seal pattern material is dispensed and the substrate and the encapsulation substrate are bonded to each other and receive pressure, the degree of spreading of the seal pattern material is different for each area due to surface deviation of the substrate, which reaches about 0.8 mm. In this case, a region in which a seal pattern is formed relatively thin acts as a lateral moisture permeation route, leading to shortening of the lifespan. This problem with the prior art is solved by the organic light-emitting display device of the present disclosure.

As is apparent from the above description, the organic light-emitting display device of the present disclosure has the following effects.

It is possible to reduce variation in density among the areas on the top surface of the substrate, which overlap the seal pattern, thereby making the width of the seal pattern uniform for each area. As a result, it is possible to prevent shortening of the lifespan attributable to permeation of moisture through an area in which the seal pattern is formed relatively thin, and improve the reliability of the device.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting display device, comprising:
a substrate including an active area having a plurality of sub-pixels and a non-active area around a periphery of the active area, the non-active area including a pad portion at a first side, gate-driving portions at second and third sides that are contiguous to respective ends of the first side, and a non-pad portion at a fourth side that faces the first side and is located between the gate-driving portions at the second and third sides;
an encapsulation substrate disposed to face the substrate;
a first dam pattern and a second dam pattern spaced apart from each other in the non-active area of each of the first to fourth sides, each of the first dam pattern and the second dam pattern being formed in a closed-loop configuration;
a seal pattern located between the first dam pattern and the second dam pattern and located between the substrate and the encapsulation substrate, the seal pattern being only in the non-active area; and
a first compensation pattern in the non-active area of the fourth side, wherein the seal pattern fully overlaps the first compensation pattern,
wherein each of the sub-pixels includes at least one thin-film transistor, an overcoat layer covering the thin-film transistor, and an organic light-emitting diode located on the overcoat layer and electrically connected to the thin-film transistor, the organic light-emitting diode including a first electrode, an organic light-emitting layer and a second electrode, and
wherein the second electrode is formed as a single body in an entire region of the active area, and extends outwards from the active area and is at least partially overlapped by the seal pattern.

2. The organic light-emitting display device according to claim 1, further comprising:
a second compensation pattern in the non-active area of each of the second and third sides, the second compensation pattern having a lower density than the first compensation pattern, the seal pattern covering the second compensation pattern.

3. The organic light-emitting display device according to claim 1, further comprising:
a protective film between the first compensation pattern and the seal pattern, and between the second compensation pattern and the seal pattern,
wherein the protective film extends to the active area and covers the second electrode.

4. The organic light-emitting display device according to claim 3, wherein the protective film covers each of the first compensation pattern and the second compensation pattern, and is spaced apart from the first dam pattern, an edge of the protective film being covered by the seal pattern, and
wherein the seal pattern includes a plurality of getters located within the seal pattern.

5. The organic light-emitting display device according to claim 1, wherein the second dam pattern is located adjacent to the active area, the second dam pattern being between the first dam pattern and the active area,
wherein the overcoat layer extends from the active area into the non-active area and is at least partially overlapped by the seal pattern,
wherein the first dam pattern is spaced apart from the first compensation pattern and the second compensation pattern, and
wherein the second dam pattern overlaps the overcoat layer.

6. The organic light-emitting display device according to claim 5, wherein each of the sub-pixels further includes a bank corresponding to a boundary portion of each of the sub-pixels on the overcoat layer.

7. The organic light-emitting display device according to claim 6, wherein each of the first compensation pattern and the second compensation pattern includes a same material as one of the overcoat layer or the bank.

8. The organic light-emitting display device according to claim 6, wherein the first compensation pattern includes a first layer formed of a same material as the overcoat layer and a second layer formed of a same material as the bank, and wherein the second compensation pattern is formed of a same material as one of the overcoat layer or the bank.

9. The organic light-emitting display device according to claim 6, wherein each of the first compensation pattern and the second compensation pattern is spaced apart from the bank, and is formed of a same material as the bank.

10. The organic light-emitting display device according to claim 6, wherein the second dam pattern is located on the overcoat layer, and
wherein the first dam pattern includes a dummy overcoat layer disposed at a lower portion of the first dam pattern.

11. The organic light-emitting display device according to claim 1, wherein the seal pattern has a uniform cross-sectional area for each of the first to fourth sides.

12. The organic light-emitting display device according to claim 1, further comprising:
a third dam pattern and a fourth dam pattern formed on a surface of the encapsulation substrate that faces the substrate, the third dam pattern and the fourth dam pattern respectively facing the first dam pattern and the second dam pattern; and
a filler disposed in the active area between the substrate and the encapsulation substrate.

13. The organic light-emitting display device according to claim 12, further comprising a black matrix layer and a color filter layer formed on a surface of the encapsulation substrate that faces the active area of the substrate,
wherein the third dam pattern and the fourth dam pattern are formed of a same material at least one of the black matrix layer or the color filter layer.

14. The organic light-emitting display device according to claim 1, wherein the first compensation pattern is spaced apart from the overcoat layer, and overlaps a ground wiring layer that is provided in the non-active area of the fourth side and is formed on a same layer as one electrode of the thin-film transistor.

15. The organic light-emitting display device according to claim 1, wherein the gate-driving portions at each of the second and third sides includes three layers, the three layers including a gate metal layer, a semiconductor layer, and a source metal layer, and
wherein the second compensation pattern is spaced apart from the overcoat layer, and overlaps the gate-driving portions.

16. The organic light-emitting display device according to claim 1, wherein, among the non-active area of the first to fourth sides, a density of components on the substrate in the non-active area of the first side is highest, and a density of components on the substrate in the non-active area of the fourth side is lowest.

17. The organic light-emitting display device according to claim 1, wherein a width of overlap between the seal pattern and the overcoat layer in the non-active area of the first side is larger than a width of overlap between the seal pattern and the overcoat layer in the non-active area of each of the second, third, and fourth sides.

18. The organic light-emitting display device according to claim 17, further comprising:
a shorting bar formed of a same material as the first electrode, the shorting bar in contact with a top surface of the overcoat layer and overlapped by the seal pattern,
wherein an area of the shorting bar in the non-active area of the first side is larger than an area of the shorting bar in the non-active area of each of the second, third, and fourth sides.

* * * * *